US007650587B2

United States Patent
Baum et al.

(10) Patent No.: US 7,650,587 B2
(45) Date of Patent: Jan. 19, 2010

(54) LOCAL COLORING FOR HIERARCHICAL OPC

(75) Inventors: Zachary Baum, Gardiner, NY (US); Ioana Graur, Poughkeepsie, NY (US); Lars W. Liebmann, Poughquag, NY (US); Scott M. Mansfield, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 11/564,957

(22) Filed: Nov. 30, 2006

(65) Prior Publication Data

US 2008/0134130 A1    Jun. 5, 2008

(51) Int. Cl.
*G06F 17/50* (2006.01)
(52) U.S. Cl. .......................................... 716/20; 716/19
(58) Field of Classification Search .................... 716/19, 716/20
See application file for complete search history.

(56) References Cited

U.S. PATENT DOCUMENTS

| | | | |
|---|---|---|---|
| 5,481,473 A | 1/1996 | Kim et al. | |
| 5,682,323 A | 10/1997 | Pasch et al. | |
| 5,883,813 A | 3/1999 | Kim et al. | |
| 5,923,566 A | 7/1999 | Galan et al. | |
| 6,057,063 A | 5/2000 | Liebmann et al. | |
| 6,180,293 B1 | 1/2001 | Tanaka et al. | |
| 6,503,666 B1 | 1/2003 | Pierrat | |
| 6,505,327 B2 * | 1/2003 | Lin | 716/5 |
| 6,730,463 B2 | 5/2004 | Heissmeier et al. | |
| 6,795,961 B2 | 9/2004 | Liebmann et al. | |
| 6,829,380 B1 | 12/2004 | Choo et al. | |
| 6,854,104 B2 | 2/2005 | Aleshin et al. | |
| 6,927,005 B2 | 8/2005 | Liebmann et al. | |
| 6,928,636 B2 | 8/2005 | Ohnuma | |
| 6,934,929 B2 | 8/2005 | Brist et al. | |
| 2002/0083410 A1 * | 6/2002 | Wu et al. | 716/19 |
| 2003/0014732 A1 * | 1/2003 | Liu et al. | 716/21 |
| 2003/0056190 A1 | 3/2003 | Liu et al. | |
| 2003/0229879 A1 | 12/2003 | Pierrat | |
| 2004/0122636 A1 | 6/2004 | Adam | |
| 2005/0060682 A1 | 3/2005 | Wu et al. | |

* cited by examiner

*Primary Examiner*—Vuthe Siek
*Assistant Examiner*—Aric Lin
(74) *Attorney, Agent, or Firm*—DeLio & Peterson, LLC; Kelly M. Nowak; Joseph Petrokaitis

(57) ABSTRACT

A method for designing a mask for fabricating an integrated circuit is provided wherein a mask layout that requires coloring, such as for alternating phase shift, double-exposure and double-exposure-etch masks, is organized into uncolored hierarchical design units. Prior to modification by OPC, each hierarchical design unit is locally colored. OPC is then performed on the locally colored hierarchical design unit. The local coloring information for the hierarchically arranged OPC-modified design unit may be discarded. After OPC modification, the uncolored OPC-modified design units may be placed within the mask layout, and the flattened data may be colored. Thus, turnaround time for mask design is significantly improved since the numerically intensive OPC is performed on the hierarchical data, avoiding the need to perform OPC on flattened data, whereas the less intensive global coloring is performed on flattened data.

3 Claims, 12 Drawing Sheets

LOCAL COLORING FOR HIERARCHICAL OPC

BACKGROUND OF THE INVENTION

1. Field of the Invention

This invention generally relates to VLSI circuit design and more specifically relates to optical proximity correction in the design of lithographic masks that require coloring, for example, in alternating phase shift masks or double exposure masks.

2. Description of Related Art

Integrated circuits including very large scale integrated (VLSI) complementary metal oxide semiconductor (CMOS) devices are manufactured on a silicon wafer by a sequence of material additions (i.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well-defined regions.

Lithography in the context of VLSI manufacturing of CMOS devices is the process of patterning openings in photosensitive polymers (sometimes referred to as photoresists or resists) which define small areas in which the silicon base (or other) material is modified by a specific operation in a sequence of processing steps. The manufacturing of CMOS chips involves the repeated patterning of photoresist, followed by an etch, implant, deposition, or other operation, and ending in the removal of the expended photoresist to make way for a new resist to be applied for another iteration of this process sequence.

The basic lithography system consists of a light source, a stencil, or photomask containing the pattern to be transferred to the wafer, a collection of lenses, and a means for aligning existing patterns on the wafer with patterns on the mask. Since a wafer containing from fifty to one hundred chips is patterned in steps of one to four chips at a time, a lithography stepper is limited by parameters described in Rayleigh's equation:

$$R = k_l \frac{\lambda}{NA} \quad (1)$$

where $\lambda$ is the wavelength of the light source used in the projection system and NA is the numerical aperture of the projection optics used. $k_1$ is a factor describing how well a combined lithography system can utilize the theoretical resolution limit in practice and can range from 0.8 down to 0.5 for standard exposure systems. The highest resolution in optical lithography is currently achieved with deep ultra violet (DUV) steppers operating at 248 nm wavelength. Steppers operating at a wavelength of 356 nm are also in widespread use.

Conventional photomasks consist of chromium patterns on a quartz plate, allowing light to pass wherever the chromium is removed from the mask. Light of a specific wavelength is projected through a mask onto the photoresist coated wafer, exposing the resist wherever holes are patterned on the mask. Exposing the resist to light of appropriate wavelength causes modifications in the molecular structure of the resist polymers which allows a developer chemical to dissolve and remove the resist in the exposed areas. (Conversely, negative resist systems allow only unexposed resist to be developed away.) The photomask, when illuminated, can be pictured as an array of individual, infinitely small light sources, which can be either turned on (points covered by clear areas) or turned off (points covered by chrome).

These conventional photomasks are commonly referred to as chrome on glass (COG) binary masks. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to $\lambda$/NA (NA being the numerical aperture of the exposure system), electric field vectors of nearby images will interact and add constructively. The resulting light intensity curve between features is not completely dark, but exhibits significant amounts of light intensity created by the interaction of adjacent features. The resolution of an exposure system is limited by the contrast of the projected light image, that is, the intensity difference between adjacent light and dark features. An increase in the light intensity in nominally dark regions will eventually cause adjacent features to print as one combined structure rather than discrete images.

The quality with which small images can be replicated in lithography depends largely on the available process latitude; that is the amount of allowable dose and focus variation that still results in correct image size. Phase shifted mask (PSM) lithography improves the lithographic process latitude or allows operation of a lower $k_1$ value (see equation 1) by introducing a third parameter on the mask. The electric field vector, like any vector quantity, has a magnitude and direction, so in addition to turning the electric field amplitude on and off, the phase of the vector can be changed. This phase variation is achieved in PSM's by modifying the length that a light beam travels through the mask material. By recessing the mask by the appropriate depth, light traversing the thinner portion of the mask and light traversing the thicker portion of the mask will be 180° out of phase; that is, their electric field vectors will be of equal magnitude but point in exactly opposite directions so that any interaction between these light beams results in perfect cancellation. For more information on PSM, the reader is referred to "Phase-Shifting Mask: Strategies: Isolated Dark Lines," Marc D. Levenson, Microlithography World, March/April 1992, pp. 6-12. The limits of PSM lithography can be uniquely challenged by the manufacture of high-performance logic derivatives of advanced Dynamic Random Access Memory (DRAM) technologies. These technologies are entering development cycles with immediate requirements for sub-quarter micron printed gate lengths and tight dimensional control on the gate structures across large chip areas. Since these logic technologies are based on shrinking the gate length in an established DRAM technology, the overall layout pitch remains constant for all critical mask levels, resulting in narrow, optically isolated lines on the scaled gate level. The requirement for tight line width control on narrow isolated lines drives the requirement of phase edge PSM's for these logic applications. Phase edge PSM lithography makes use of contrast enhancement caused by a phase transition under an opaque feature on a mask. This phase transition is achieved by etching an appropriate depth into the quartz mask substrate on one side of a narrow line structure on the mask. Since the 180° phase transition forces a minimum in the image intensity, narrow dark lines will be printed by these excess phase edges. Currently, the unwanted images are erased using a trim mask, a second mask that transmits light only in regions left unexposed by the residual phase edge.

Even though resolution enhancement through the use of phase shifted masks has been extensively proven, implementation of this technique is critically dependent on computer assisted design (CAD) technology that can modify existing circuit designs to incorporate the additional design levels needed to build a phase shifted mask. Design modifications consist of defining regions on the mask that require phase shifting (i.e., by etching into the mask substrate), and trim regions required to eliminate lines printed by unwanted phase edges, and then inserting additional shapes on the respective design levels (ie: phase, trim). The process of defining portions of the mask as 0° phase transition and other portions as 180° phase transition is generally referred to as phase coloring. The challenge for phase coloring algorithms to find a globally correct solution depends highly on design styles. Thus such algorithms have been difficult to effectively automate.

Currently phase coloring is considered a binary design problem and uses nets and net coloring to form the mask. The method in general assigns binary qualities (such as "−" or "+") in a way that eliminates conflicts between design elements. In phase-shifted mask designs, portions of the mask are assigned a 0° phase shift and other portions are assigned 180° phase shifts such that the image intensity between the portions is minimized. Thus, the phase shifted mask design is a type of binary problem, one that can be solved using phase coloring.

Phase coloring methods can be adapted to generate phase-shifted mask designs from traditional flat VLSI CAD data or hierarchical VLSI CAD data.

A method for phase coloring for flat databases and hierarchial databases is shown in U.S. Pat. No. 5,883,813 to Kim et al. and which is assigned to the assignee of the present invention. This patent is incorporated herein by reference.

CAD data structures for a VLSI circuit design can include either flat data structures or hierarchical data structures. The CAD data structure inputs include each shape element to be fabricated on a mask, and the location of that shape on the mask. Of course, such a data structure for a VLSI device is extremely complex, and could contain millions of shapes for each mask, with several masks required for each device. Preferably, the data is maintained in hierarchical data structures for minimizing storage and computational resources.

In the generation of phase shift masks, the phase coloring of one shape can affect the phase coloring of a "nearby" shape. Such shapes are "coupled" with respect to phase coloring. Each pair of nearby shapes is referred to as an "intrusion pair," meaning the phase of one determines the phase of the other. The CAD data structure input preferably contains a list of all intrusion pairs or otherwise contains the data from which the intrusion pair list can be derived.

The method of the Kim patent forms a database of element shapes and their color is assigned. This data base is generally referred to as a net list. A net is a set of shapes that are phase coupled together and are treated as a single entity, with the phase coupling as the "connected" function that allows the shapes to be stored as a net. Nets that are elements of higher level nets are referred to as "nested nets".

The method continues until all intrusion pairs have been located and assigned a color and a net. Those shapes that are not nearby any other shape can be arbitrarily assigned either color unless otherwise constrained.

In addition to working with flat VLSI CAD data structures, the Kim et al. patent can be applied to hierarchical VLSI CAD data structures. Many CAD systems describe the physical design of VLSI devices in the form of hierarchical 2-dimensional geometric models. These systems simplify the complex task of designing VLSI devices, but have traditionally had problems analyzing the hierarchical design. The primary reason for this is that traditional methods have analyzed the data flat, (i.e., all instances of mask shapes are transformed into the coordinate system of the root node of the design) whereas mask data is typically designed nested (i.e., the mask shapes are designed hierarchically and may be reused in a design many times). One system and method for creating hierarchical representations of interconnections between VLSI circuit design components to facilitate the analysis of a design while still in its nested form was described by Kim et al. in "System and Method for Building Interconnections in Hierarchical Circuit Design," U.S. Pat. No. 5,481,473, and assigned to International Business Machines Corp. and incorporated herein by reference. The system uses a form of the graphical technique known as inverse layout trees to describe the interconnections. The inverse layout tree is a forest of trees each rooted at a leaf node of the layout tree. Thus, in a typical implementation, a design mask shape would form the root of an inverse layout tree, while the leaves would represent flat layouts of the rooted mask shape. The use of the inverse layout tree has provided a means for manipulating instances of a mask shape at varying levels of nesting.

This system uses nets to group components of a design that are interconnected by some set of rules. In particular, the system uses nested net synthesis to identify and store the interconnection data between shapes in a nested component design. In particular, the system uses nested net synthesis to identify and store interconnections (such as electric or magnetic interconnections) of VLSI design components of a nested design while maintaining the data in its nested form.

Similarly, nested net synthesis can be used to identify and store phase coupling between mask shapes in a hierarchical VLSI database and the Kim et al. method can operate on this database to appropriately color the mask shapes to minimize the image intensity between them. Groups of locally interacting mask shapes are represented by independent subnets of mask shapes within the layout tree.

Thus, the Kim et al. method automatically colors VLSI design elements for the purpose of assigning binary properties to the elements. The method of Kim et al. attempts to find a clean coloring solution within each of the subnets by traversing the subnet and flipping the color of elements while attempting to find a clean coloring solution without flattening the data. However, as design density increases, subnet sizes increase and the probability of finding a clean coloring solution is significantly diminished, and flattening becomes required.

Adding phase modulation to the photomask can profoundly increase the attainable resolution. Other resolution enhancement methods have also been shown to increase attainable resolution and some of these must also undergo a coloring step similar to alternating phase shift masks. An example of one of these methods is the decomposition of a single patterning layer into two layers that are printed on two masks. The assignment of particular shapes to each decomposed mask is referred to hereinafter as coloring (which is analogous to assigning phase coloring in altPSM technology). Each of the two masks is then exposed on the wafer and their resulting images recombined to form the original desired pattern. If both masks are exposed into a single film of photoresist, this technique is generally referred to as double-exposure (DE), which is widely known in the art. If the first exposure is transferred into a secondary film and then another layer of photoresist added to the wafer and exposed with the second mask, the technique is often called double-exposure-double-etch (DE2) which is also known in the art. Although these patterning techniques are known, they are not widely practiced due to, among other reasons, the difficulty of decomposing a realistic design layout into two mask layers.

Sub-wavelength lithography, where the size of printed features is smaller than the exposure wavelength, places a tremendous burden on the lithographic process. Distortions of the intended images inevitably arise, primarily because of the nonlinearities of the imaging process and the nonlinear response of the photoresist. Two of the most prominent types of distortions are the wide variation in the linewidths of identically drawn features in dense and isolated environments (dense-iso bias) and the line-end pull-back or line-end shortening (LES) from drawn positions. The former type of distortion can cause variations in circuit timing and yield, whereas the latter can lead to poor current tolerances and higher probabilities of electrical failure.

Optical proximity correction or optical proximity compensation (OPC) is the technology used to compensate for these types of distortions. OPC is loosely defined as the procedure of compensating (pro-distorting) the mask layout of the critical IC layers for the lithographic process distortions to follow. This is done with specialized OPC software. In the heart of the OPC software is a mathematical description of the process distortions. This description can either be in the form of simple shape manipulation rules, in which case the OPC is referred to as "rule-based OPC or a more detailed and intricate process model for a "model-based OPC (MBOPC)." The OPC software automatically changes the mask layout by moving segments of line edges and adding extra features that (pre-) compensate the layout for the distortions to come. Although after OPC has been performed the mask layout may be quite different than the original (before OPC) mask, the net result of this procedure is a printed pattern on the wafer that is closest to the IC designer's original intent. There are commercially available software tools that perform OPC on a full-chip scale. OPC relies heavily on speedy calculations of the image intensity at selected points of the image field.

In general, with large densely packed designs, photomasks that require coloring, such as alternating PSM or decomposed masks for DE or DE2, are typically flattened (i.e. to the top level of the hierarchy) in obtaining the coloring solution. Thus, flattened data is passed down to the OPC engine which spends days in processing and is generally ineffective. Therefore, there is a need for a more efficient OPC technology that takes advantage of the hierarchical data structure for densely packed photomask designs that require coloring.

SUMMARY OF THE INVENTION

Bearing in mind the problems and deficiencies of the prior art, it is therefore an object of the present invention to provide a method for designing masks requiring coloring for making integrated circuits and avoiding data flattening due to color conflict resolution.

It is another object of the present invention to provide a computer program product comprising a computer readable storage medium having stored therein instructions executable by the computer for designing masks requiring coloring for making integrated circuits.

Still other objects and advantages of the invention will in part be obvious and will in part be apparent from the specification.

Broadly stated, the invention is directed to a model-based optical proximity correction (MBOPC) methodology that performs MBOPC on hierarchical design units prior to global coloring. Although embodiments of the invention will be described specifically in terms of phase coloring, it is recognized that other coloring operations besides phase coloring, such as coloring of decomposed masks, can also be used and will benefit from this method. The method of the invention avoids data flattening due to phase conflict resolution by performing MBOPC on the design layout before phase coloring, while the hierarchy is still basically intact. The phase coloring is performed after MBOPC when it is not important if the data are flattened. The method generates the phase shapes and forms OPC design unit layouts for each uncolored design unit layout but doesn't color them. Repeatable units may be tagged so that OPC is performed only once on the same repeatable unit. Then, MBOPC tiles the design and performs a temporary, local phase coloring on each unit. After OPC is completed on each colored design unit layout, the local coloring information is discarded and stored hierarchically as uncolored, OPC-modified design units. The already OPC'd phase shapes can be globally colored when placed in the overall design layout using standard methods or coloring data from a previous clean color solution verification step.

The above and other objects, which will be apparent to those skilled in the art, are achieved in the present invention, which is directed to a method for designing a mask, comprising the steps of:

providing a design layout comprising an arrangement of a plurality of instances of a hierarchical design unit including uncolored shapes to be colored;

locally coloring said uncolored shapes within said hierarchical design unit to form a locally colored design unit;

performing optical proximity correction (OPC) on said locally colored design unit to form an OPC-modified design unit;

discarding said local coloring of said OPC-modified design unit to form an uncolored OPC-modified hierarchical design unit;

arranging said uncolored OPC-modified hierarchical design unit to form a modified design layout in accordance with said arrangement; and globally coloring said modified design layout.

In another aspect, the present invention provides a program storage device readable by a machine, tangibly embodying a program of instructions executable by the machine to perform the aforementioned method steps for designing a mask that requires coloring.

According to yet another aspect, the present invention provides a method of fabricating an integrated circuit, wherein a mask is designed according to the aforementioned method steps, a mask is fabricated using the OPC-modified mask layout, and a substrate is patterned using the mask.

The method according to the invention significantly improves the turnaround time of masks that require coloring, since OPC is performed on hierarchical data rather than on flattened data.

Still other objects and advantages of the invention will in part be obvious and will in part be apparent from the detailed description.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
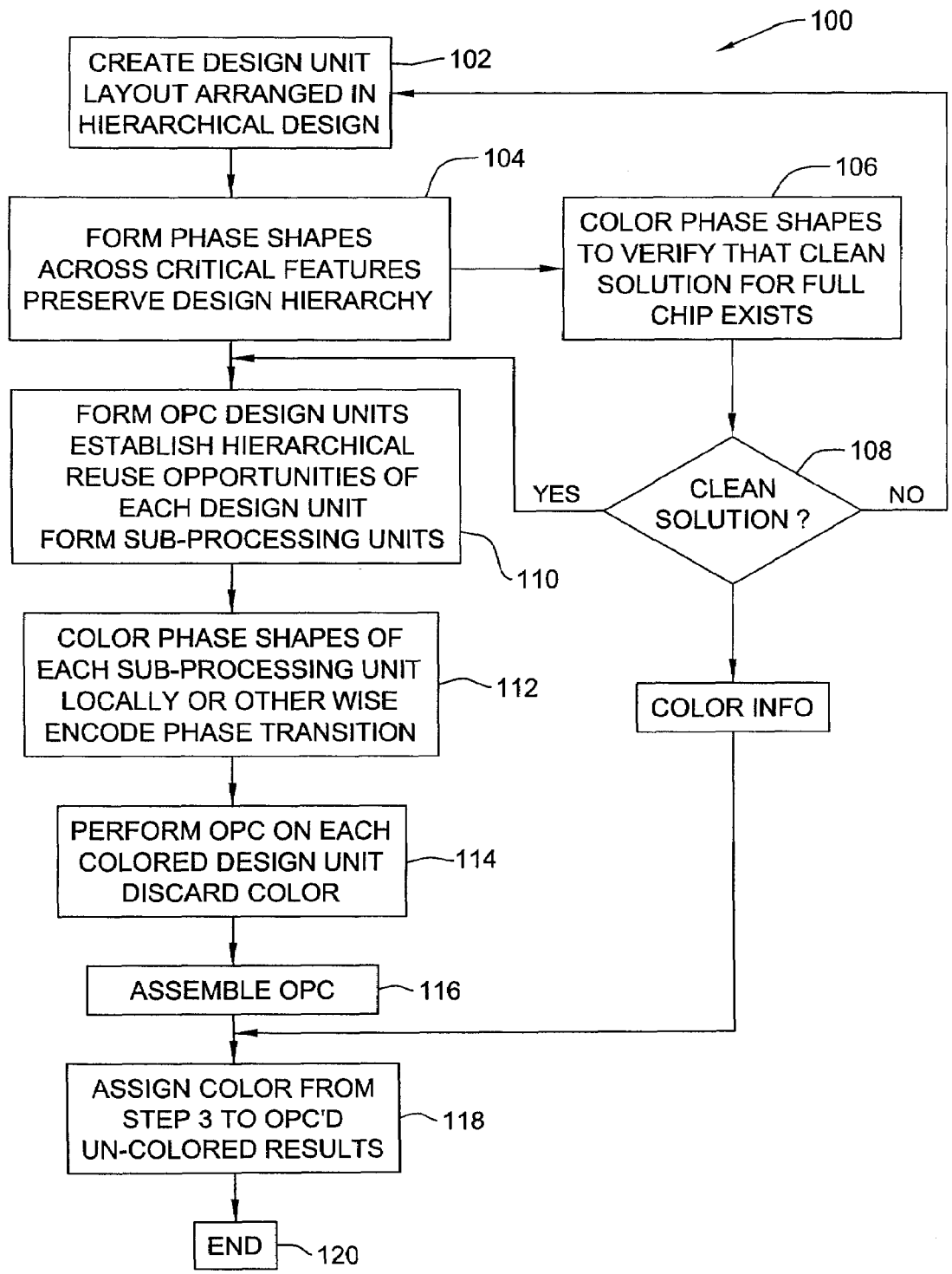
FIG. 1 is a flow diagram illustrating a method of the invention for designing an alternating phase shift mask.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention. In particular, embodiments are described with respect to alternating phase shift mask (altPSM) design, but the invention is applicable to the design of other masks that require coloring, including, but not limited to, decomposed masks for DE or DE2.

Accurate definition of mask patterns having line widths less than the wavelength of light is generally implemented using OPC (optical proximity correction), a collection of techniques for correcting beforehand the shape of mask patterns, to allow for pattern deformations on the wafer caused by the so-called optical proximity effect. This collection of OPC techniques is also called PPC (process proximity effect correction). A typical OPC tool of this type is rule-based OPC.

Rule-based OPC is implemented as follows: a test-use mask pattern is prepared using test patterns representing all patterns that are permitted by design. The test patterns are transferred through the mask pattern onto the wafer for pattern etching, whereby a test-use wafer is produced.

The pattern geometry on the test-use wafer is then measured. The measured data, together with design data from the test-use mask pattern, are used as a basis for generating rule-based OPC, i.e., a collection of design rules for determining bias data to be added to mask pattern design data. The mask pattern is then corrected using the rule-based OPC. The correction takes place at a mask pattern layout stage in the CAD process. The mask fabricated through OPC is called the OPC mask.

Apart from rule-based OPC, there is another set of corrective techniques called simulation-based OPC or model-based OPC (MBOPC).

This type of proximity effect correction involves generating a simulation-based OPC model (also called a kernel or a process model) that represents a pattern transfer process allowing for the optical proximity effect based on the measurements of a limited number of test patterns prepared beforehand. Differences in shape between the mask pattern and the pattern geometry transferred through the mask pattern onto the wafer are simulated by the simulation-based OPC model. The results of the simulation are used to correct the mask pattern.

OPC is a well-known technique used in the fabrication of electronic components such as integrated circuits and need not be detailed herein. A number of U.S. patents describe OPC including U.S. Pat. Nos. 5,682,323; 6,854,104; 6,829,380; 6,928,636; and 6,934,929. These patents are hereby incorporated by reference.

Figure 3:
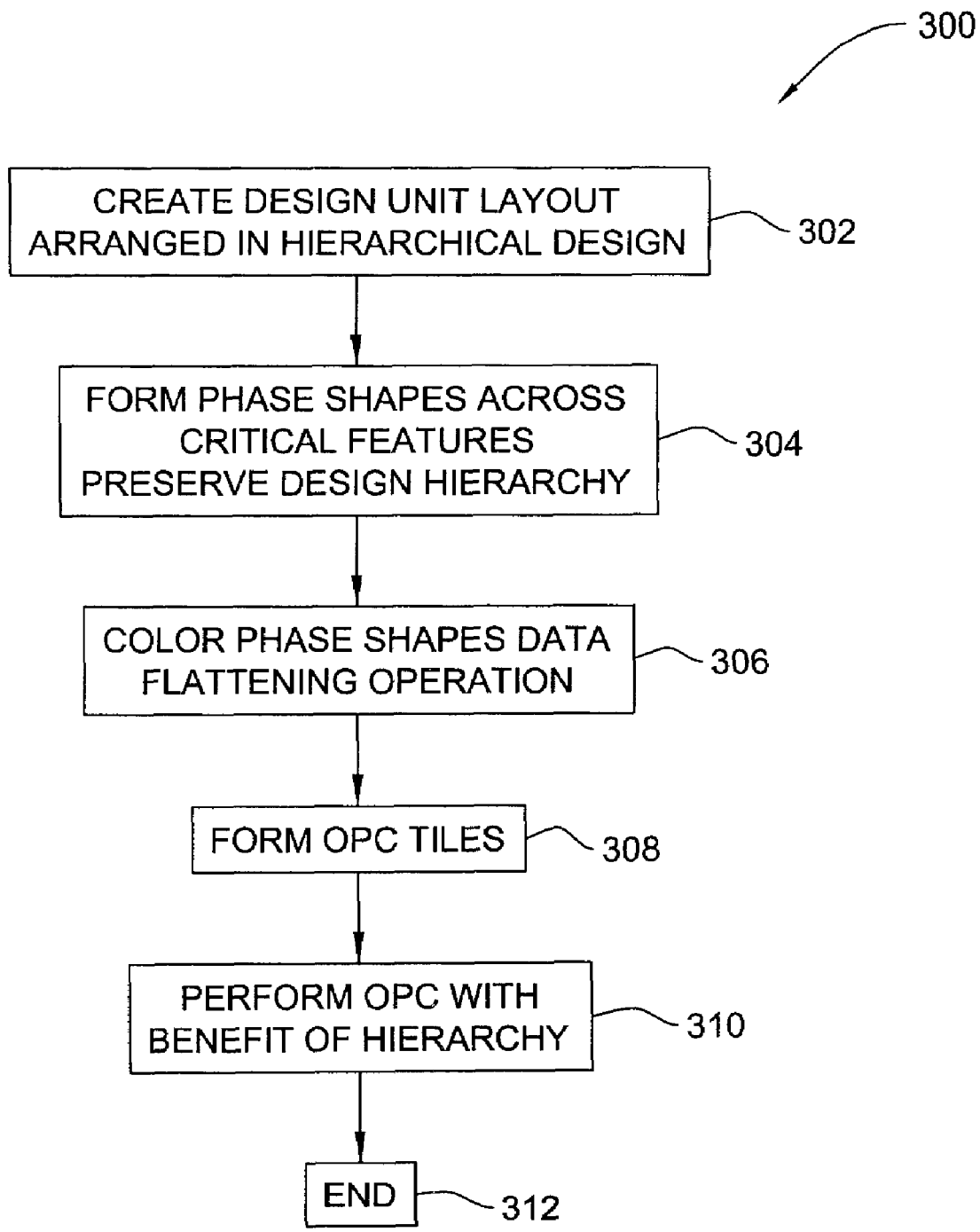
FIG. 3 is a flow diagram illustrating a method of the prior art for designing an alternating phase shift mask.

Referring first to FIG. 3, this figure shows a prior art flow sheet as numeral 300 for a sequence of steps to form an alternating phase shift mask, which method results in the flattening of data. In step 302, a design unit layout is created and arranged in hierarchial design as is known in the art. In step 304, phase shapes are formed across critical features, and hierarchical altPSM design units are formed which include both circuit design elements as well as phase shapes to be OPC'd, and the design hierarchy is preserved. The phase shapes are binary colored so as to avoid coloring conflicts in step 306, which may result in flipping the color designation of the original phase shapes. In particular, for dense designs, flattening of the data is likely to occur, as is well known in the art because previously repeatable units now are not recognized as being repeatable. The flattened, colored data is then passed to the OPC engine (steps 308 and 310). OPC tiles are formed in step 308 and in step 310 OPC is performed on the OPC tiles. The method ends in step 312 and the above prior art method results in forming an OPC'd alternating phase shift mask based on the highly flattened data.

Referring now to FIG. 1, a flow sheet of the method of the invention is shown generally as numeral 100. In this method, a design unit layout is created and arranged in hierarchial design in step 102. Phase shapes are formed across critical features and hierarchical OPC design units are formed, which include critical features of circuit elements and phase shapes to be OPC'd. Thus, the design hierarchy is preserved in step 104. Then, in accordance with one embodiment of the invention, the phase shapes are then globally colored to verify that a clean solution exists for the full chip in step 106. In step 108 the coloring step 106 is queried to determine whether or not a clean solution exists. If a clean solution does not exist, the method is returned to steps 102, 104, and 106 until a clean solution is found to exist. If no clean solution exists the method is terminated.

If a clean solution is found to exist, in one embodiment of the invention, the global coloring solution is retained. The method continues in step 110 wherein, optionally, OPC sub-processing units or tiles are formed based on the area of optical interaction. OPC tiles are units of the design typically formed for independent or parallel processing to improve turnaround time. Such OPC tiles typically include a subset of mask shapes, plus a context region around the subset of mask shapes, based on the region of optical interaction around the edges of the tile. The context region permits the OPC engine to modify the shapes near the edges of the tiles independently of the other tiles, as is known in the art. The OPC engine establishes whether an OPC design unit can be reused (are repeated), and identifies such repeatable OPC design units. If the design unit is repeated it is recognized as repeatable and marked for reuse. These design units are processed only once and are reused when the design units are assembled in step 116.

In accordance with the invention, the phase shape of each OPC design unit is then colored locally (step 112) so that the hierarchy is maintained, and then OPC is performed on each locally colored, hierarchical OPC design unit in step 114. The local coloring is then discarded for the hierarchical OPC'd design unit. The OPC'd, but uncolored, hierarchical design units are assembled in the global design layout in step 116. Color is then assigned to the assembled OPC uncolored design units from the global coloring retained from steps 106, 108. The method ends in step 120.

Figure 2:
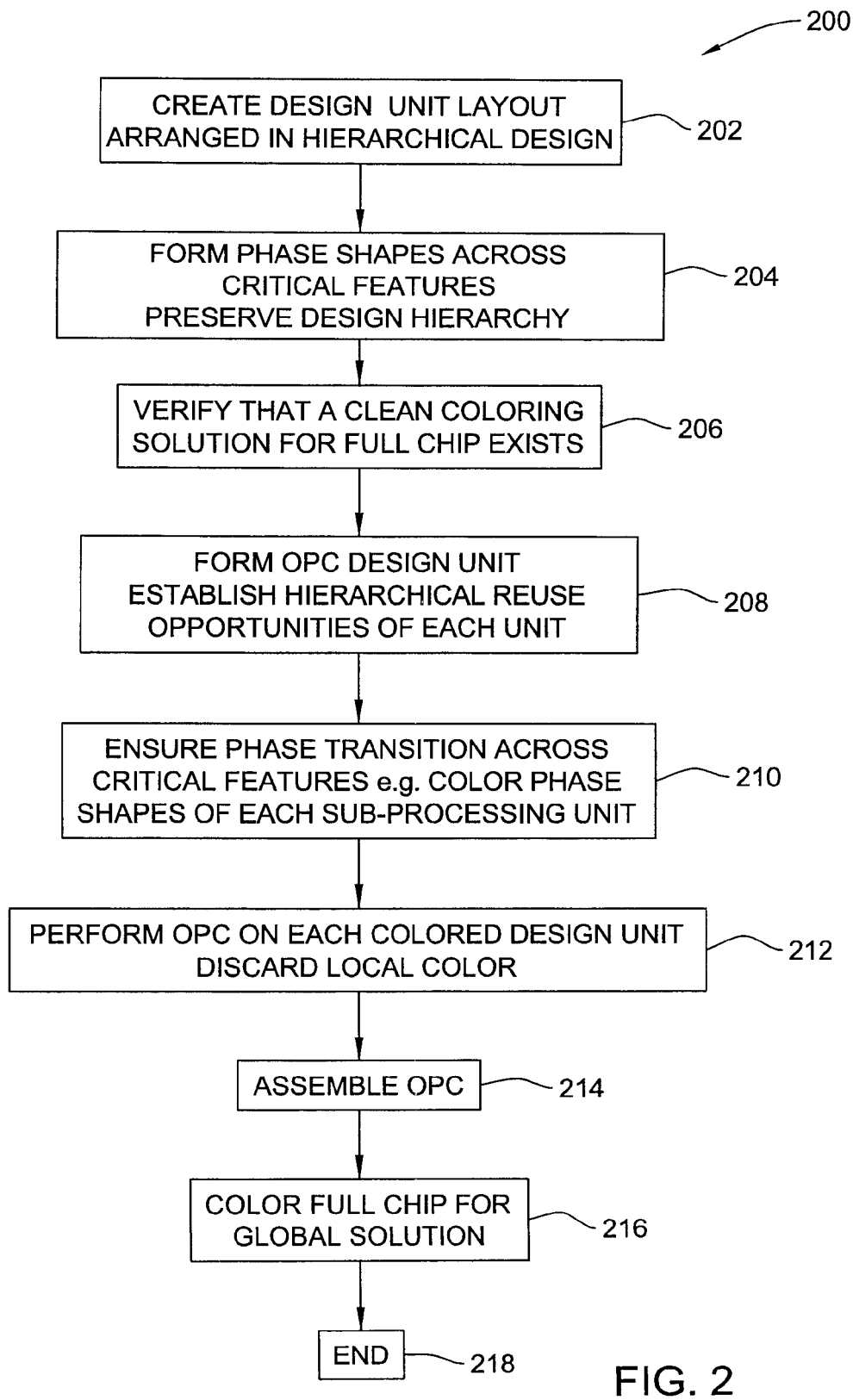
FIG. 2 is a flow diagram illustrating another method of the invention for designing an alternating phase shift mask.

Another embodiment of the method according to the invention is shown in FIG. 2 generally as numeral 200. In this method a design unit layout is created and arranged in hierarchial design in step 202. In step 204 phase shapes are formed across critical features and OPC design units are formed, including critical features of circuit and phase shapes to be OPC'd. The design hierarchy is preserved. In step 206 it is verified that a clean coloring solution exists for the full chip. For example, coloring verification may be performed without assigning phase shapes, as described in U.S. Pat. No. 5,923, 566 to Galan et al., which is assigned to the assignee of the present invention, the disclosure of which is incorporated herein by reference. In this embodiment, the global coloring solution need not be retained. In step 208 OPC processing units are optionally formed, the hierarchy of the OPC design units is established, and the reuse opportunity of each unit is also established. In step 210 the phase shapes are colored locally for each of the sub-processing units or OPC design units. OPC is performed on each locally colored, hierarchical design unit in step 212 and the local coloring is discarded. In step 214 the uncolored, hierarchical OPC design units are assembled and in step 216 the full layout is colored. Step 218 ends the method.

Figure 4A:
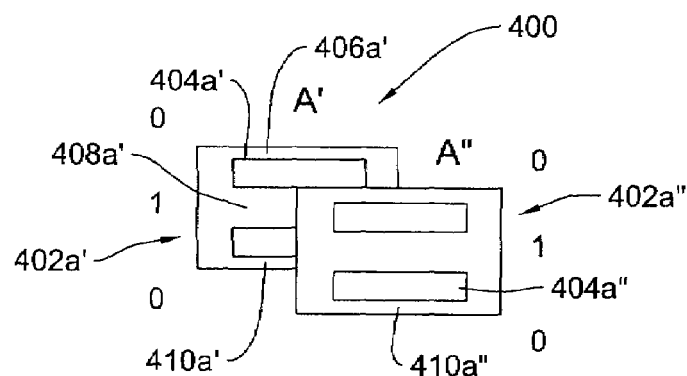
FIGS. 4A, 4B, and 4C are illustrations of how data is flattened in an odd-even phase cycle design.
Figure 4B:
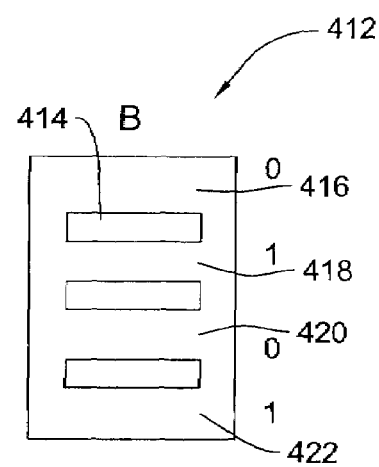
Figure 4C:
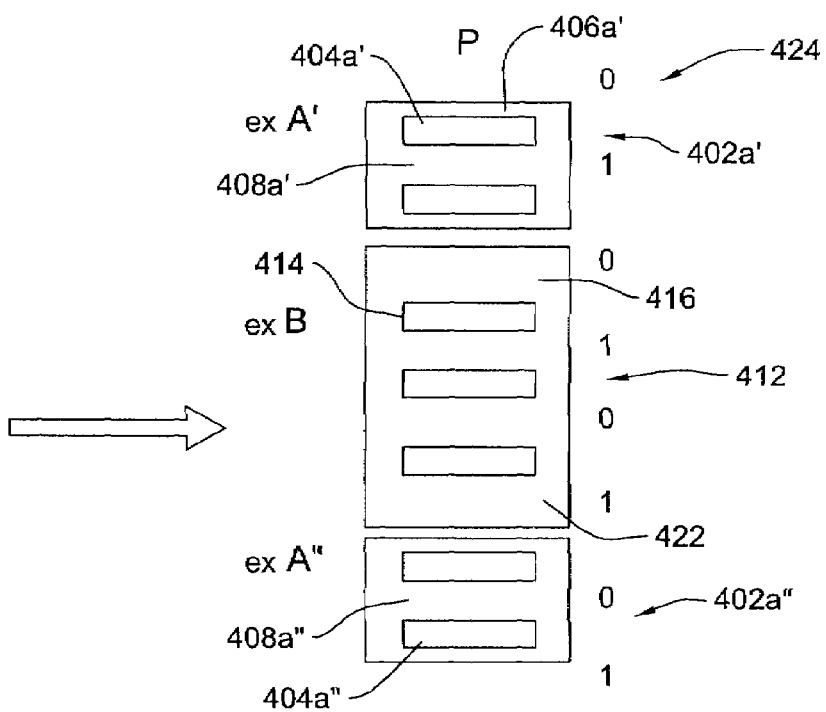

FIGS. 4A, 4B, and 4C are illustrations of how data are flattened in a prior art method used to form alternating phase shift masks.

In FIG. 4A two cells (design units) are shown generally as numeral 400 and comprise one cell 402a' and identical cell 402a". Each cell contains two features 404a' and 404a", respectively. Phase shapes 406a', 408a', and 410a' surround the features and identical phase shapes 406a", 408a", and 410a" are shown for cell 402a".

Likewise, in FIG. 4B, a cell (design unit) is shown generally as numeral 412 and comprises three features, 414, which features are separated by phase shapes 416, 418, and 420, and 422.

When the cells 402a', 402a" and 412 are placed in the layout, the coloring is flipped for one of the design units (402a") and the OPC engine cannot recognize that the flipped design unit 402a" as identical to the original cell 402a' and may be OPC processed only once. The combined design units shown generally as numeral 424, is a combination of design units 402a', 402a", and 412, and it can be seen that the coloring for unit 402a" has been changed from 0-1-0 to 1-0-1 and it forces a separate OPC operation for each unit which started out equal.

The above is a problem because the unrolling of design hierarchy affects large areas of design causing the expensive operations of OPC to take place essentially on flat data. This problem is particularly severe in dense designs where the phase information is transmitted across numerous design units.

Figure 5:
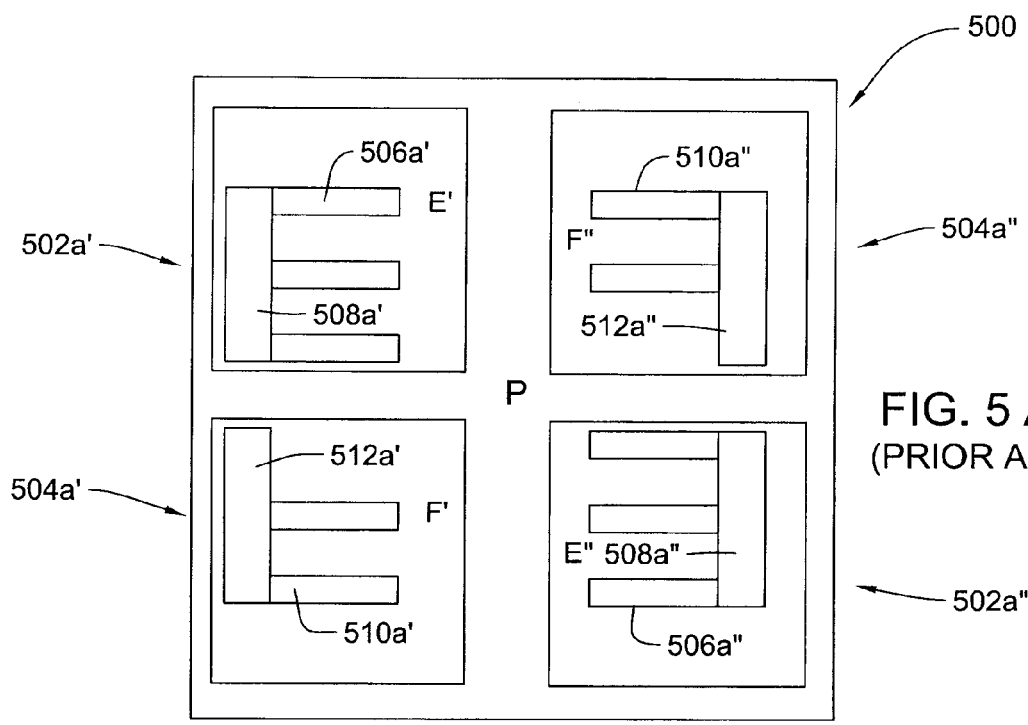
FIGS. 5A, 5B, 5C, and 5D show how data is flattened in a method of the prior art for designing an alternating phase shift mask.
Figure 5:
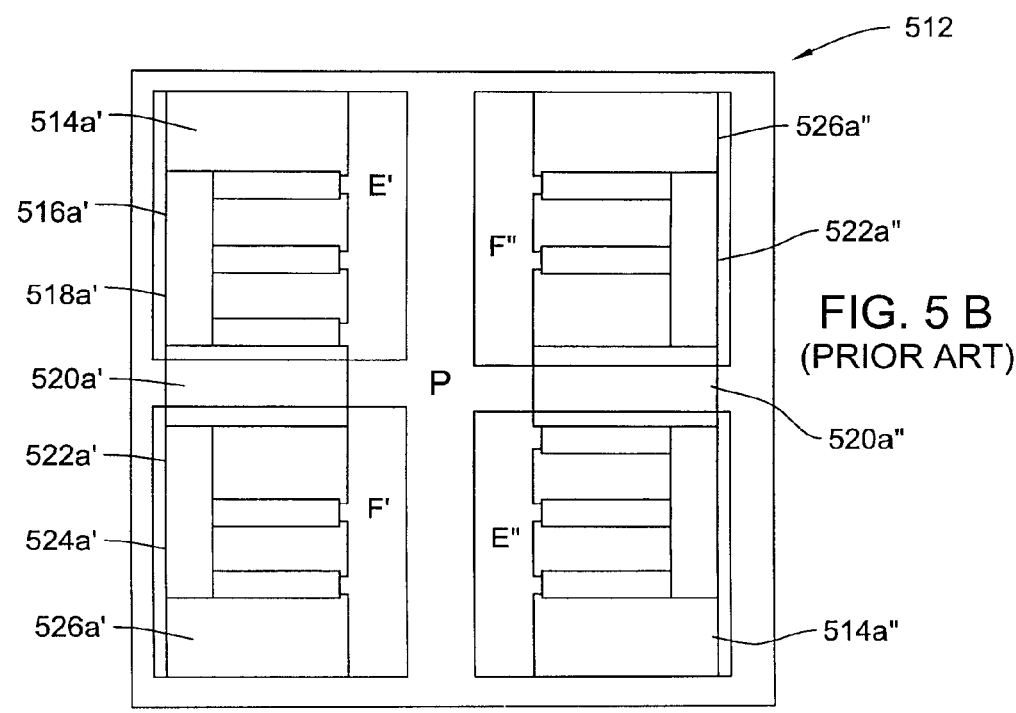

Another example of data flattening resulting from prior art methods of forming alternating phase shift masks is shown in FIGS. 5A-5B.

In this design, a prime unit is shown generally as numeral as 500 and comprises two identical cells 504a' and 504a" and two other identical cells 502a' and 502a". Each cell is a rotated placement of the other cell. The cells all contain features, such as, cell 502a' having features 506a' and 508a' and, for cell 504a', features 510a' and 512a'.

In FIG. 5B phase shapes have been formed around the features and are shown as 514a'-526a' and 514"-526a".

Figure 5C:
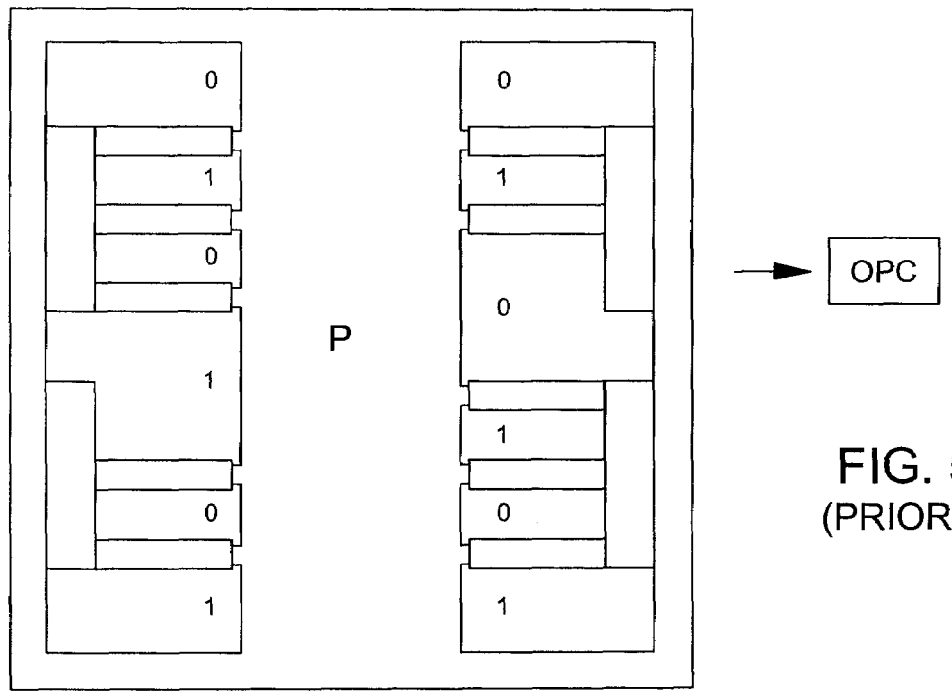
Figure 5D:
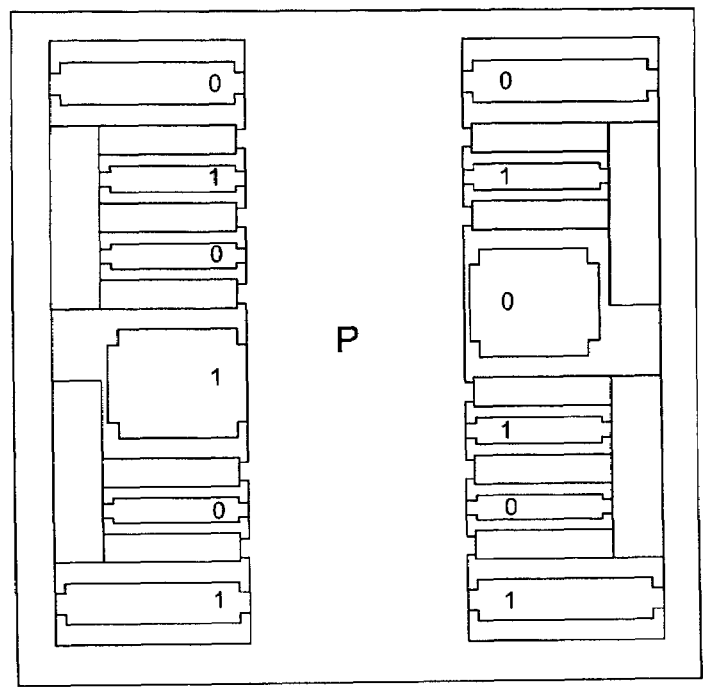

FIG. 5C shows the phase shapes colored when assembled in the layout and FIG. 5D shows the resulting colored OPC design. Note that cell 502a' started as 0-1-0-1 coloring but in identical rotated cell 502a", the coloring had to be changed to 1-0-1-0. For the OPC engine to recognize cell 502a' and cell 502a" as equal, the same phase color must be present for both cells. This is not the case since cell 502a' is 0-1-0-1 and cell 502a" is 1-0-1-0. This causes data flattening since it forces separate OPC operations for design units that started out equal to each other. Compare FIG. 7 below of the invention where 606a' and 606a" (repeatable cells) have the same coloring 0-1-0-1. This design has resulted in data flattening because each identical cell is flanked by different phase shapes and the repetitive character is lost when colored in the layout and the OPC is performed on flat data.

Figure 6:
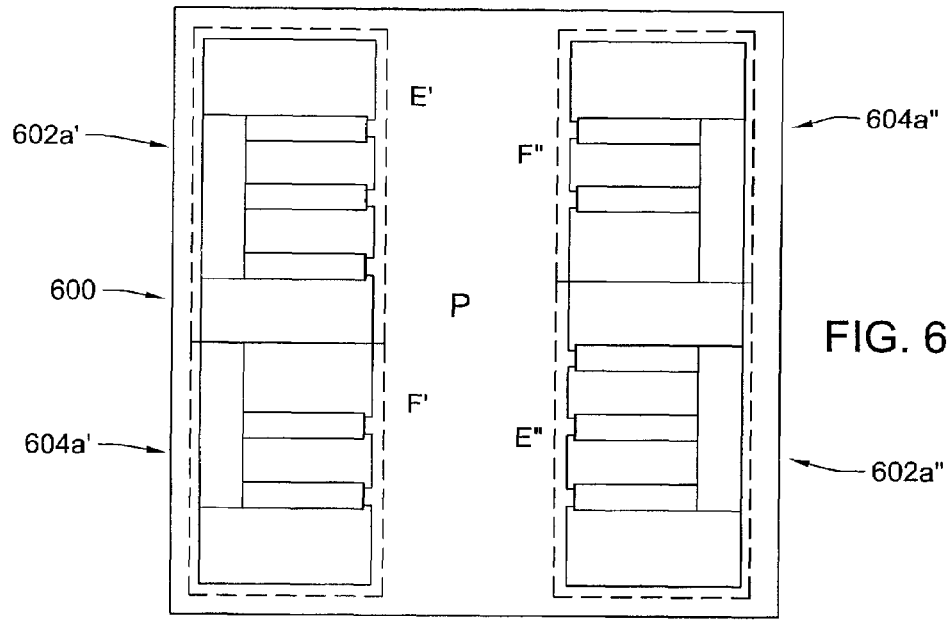
FIGS. 6, 6A, 6B, 6C, 6D, and 7-11 show a sequence of steps using the method of the invention to avoid data flattening in the designing of an alternating phase shift mask.
Figures 6A, 6B, 6C, 6D:
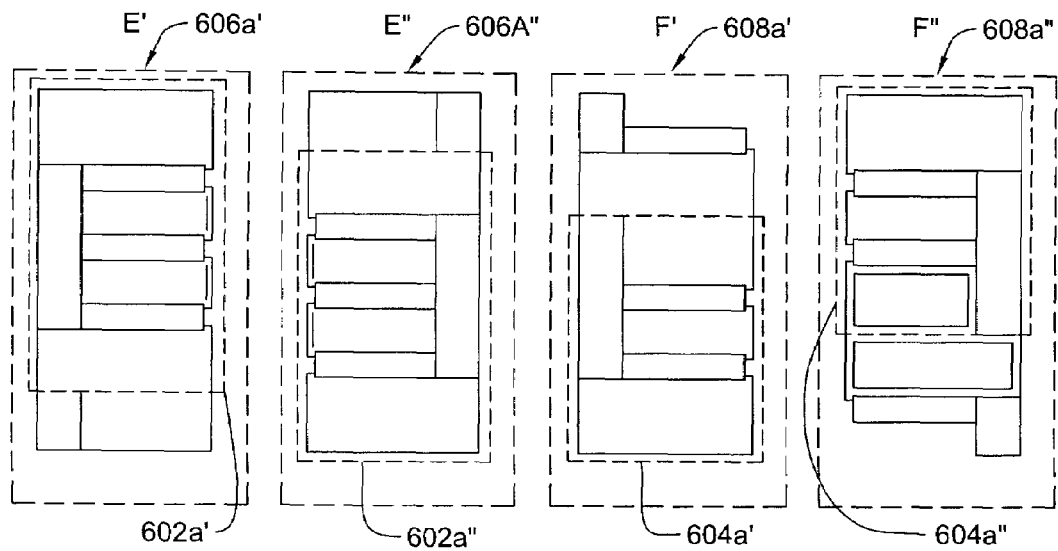

FIGS. 6, 6A-6D, and 7-11 show the method of the invention as compared to the prior art method of FIGS. 5A-5D. Accordingly, the same prime shape containing design units (including phase shapes) as shown in FIG. 5B as numeral 512 is shown in FIG. 6 as prime numeral 600. This is the same configuration as shown in FIG. 5B and the method of the invention can be demonstrated and how the method avoids data flattening. It should be noted that steps 102-108 of the invention of FIG. 1 are preferred as in FIGS. 5A-5D.

In FIG. 6 design unit 602a' and rotated design unit 602a" and unit 604a' and rotated cell unit 604a" are shown. The design units were redesigned into sub-processing units 606a', 606a" and 608a' and 608a" which are shown within the outer dotted lines. The original design units with phase shapes are shown within the inner dotted lines as the above numerals 602a', 602a", 604a', and 604a". Thus, the original cell design units have been reconfigured to sub-processing units (step 110 of FIG. 1). The design units and sub-processing units are repeatable and can be reused. They are marked by pattern recognition mechanisms in the OPC engine as repeatable, are tagged for re-use by a tagging mechanism and treated by the hierarchical engine in similar ways as other operations that are performed on a nested design unit without triggering data flattening. Their tracing is accounted for in the data representation as instance processed.

Figure 7:
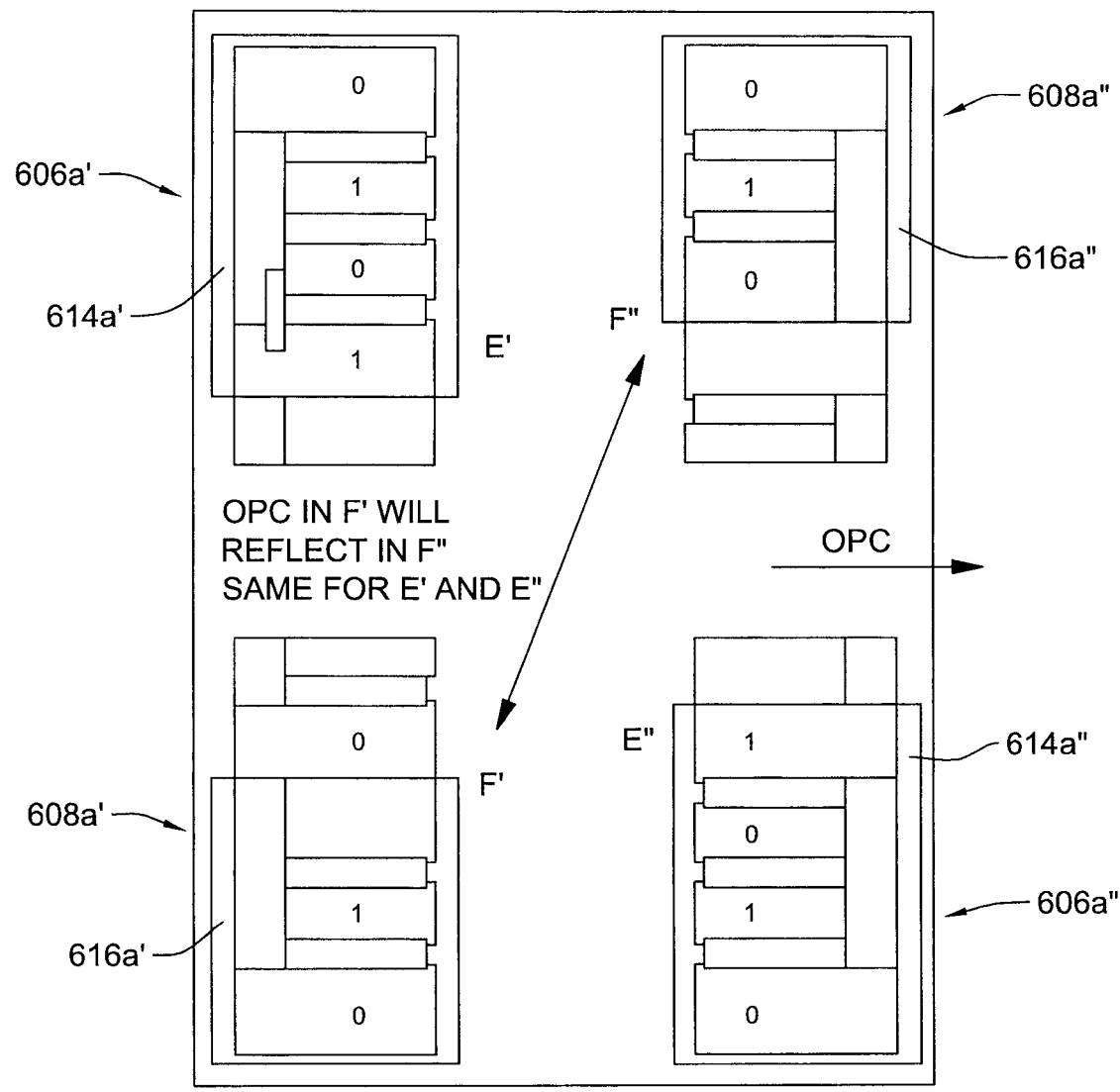

The sub-processing units are then colored locally in FIG. 7 forming new colored design units 614a', 614a", 616a', and 616a" (step 112 of FIG. 1). Note that cell 606a' and rotated cell 606a" are repeatable and local coloring results in the same coloring 0-1-0-1. The same for cells 608a' and 608a". Only one of the locally colored cells 608a' or 608a" need to be OPC'd, since they are identical after local coloring. The results are shown in FIG. 8.

Figure 8:
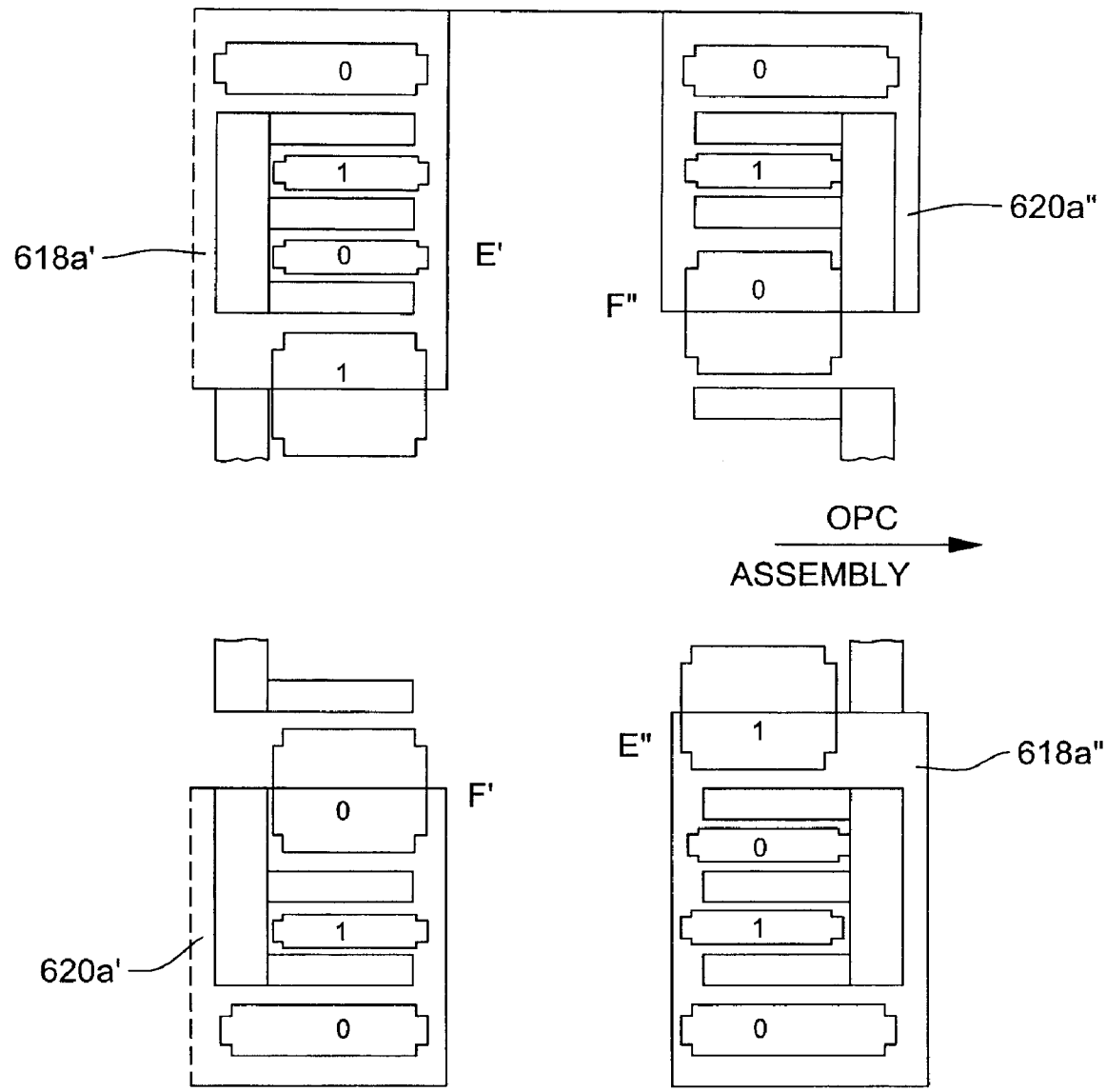

As shown in FIG. 8, each of the locally colored design units, which may include a context or buffer area that are also locally colored, are then processed by OPC forming OPC colored units 618a', 618a", 620a', and 620a". Step 114 of FIG. 1. The repeatable design units are processed only once. The resulting OPC'd design units are then stored hierarchically, but the local coloring may be discarded.

Figure 9:
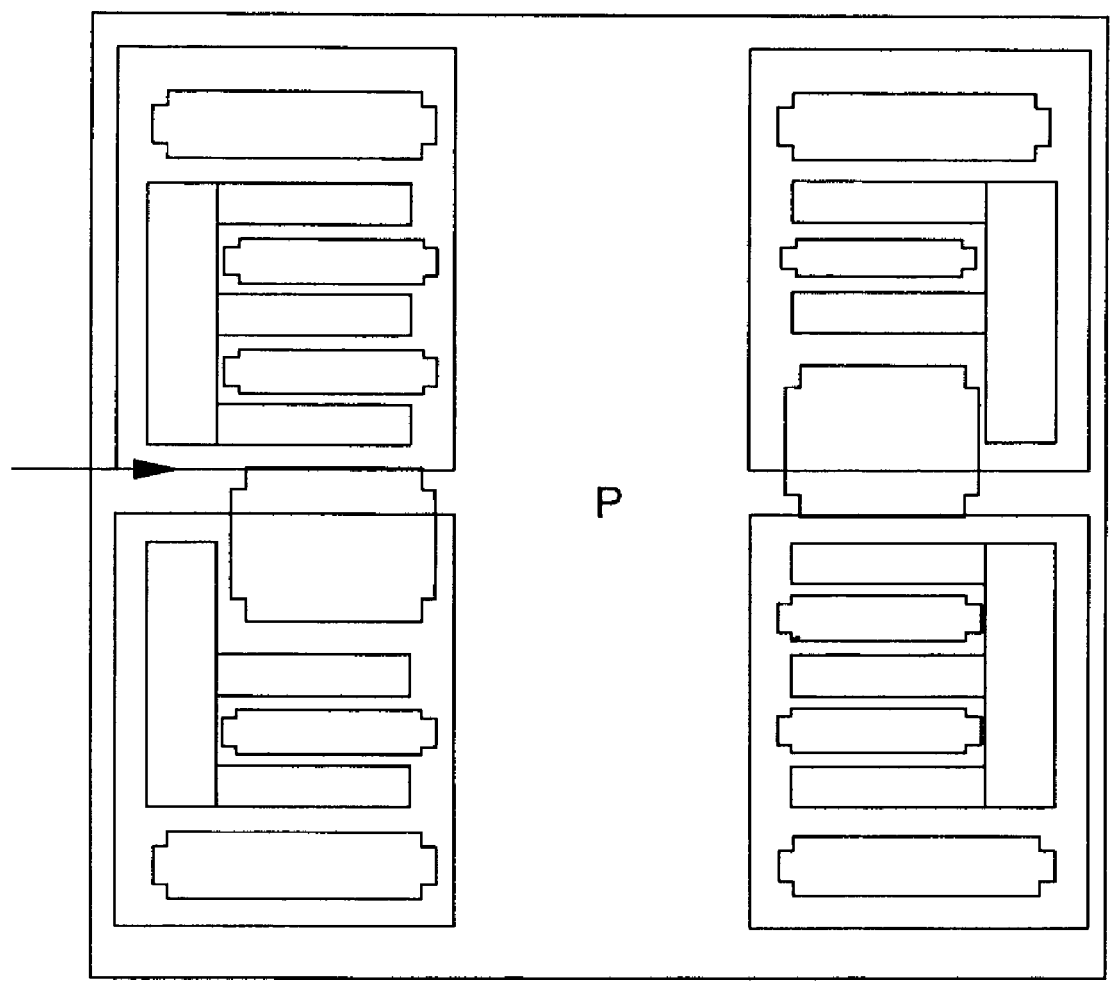
Figure 10:
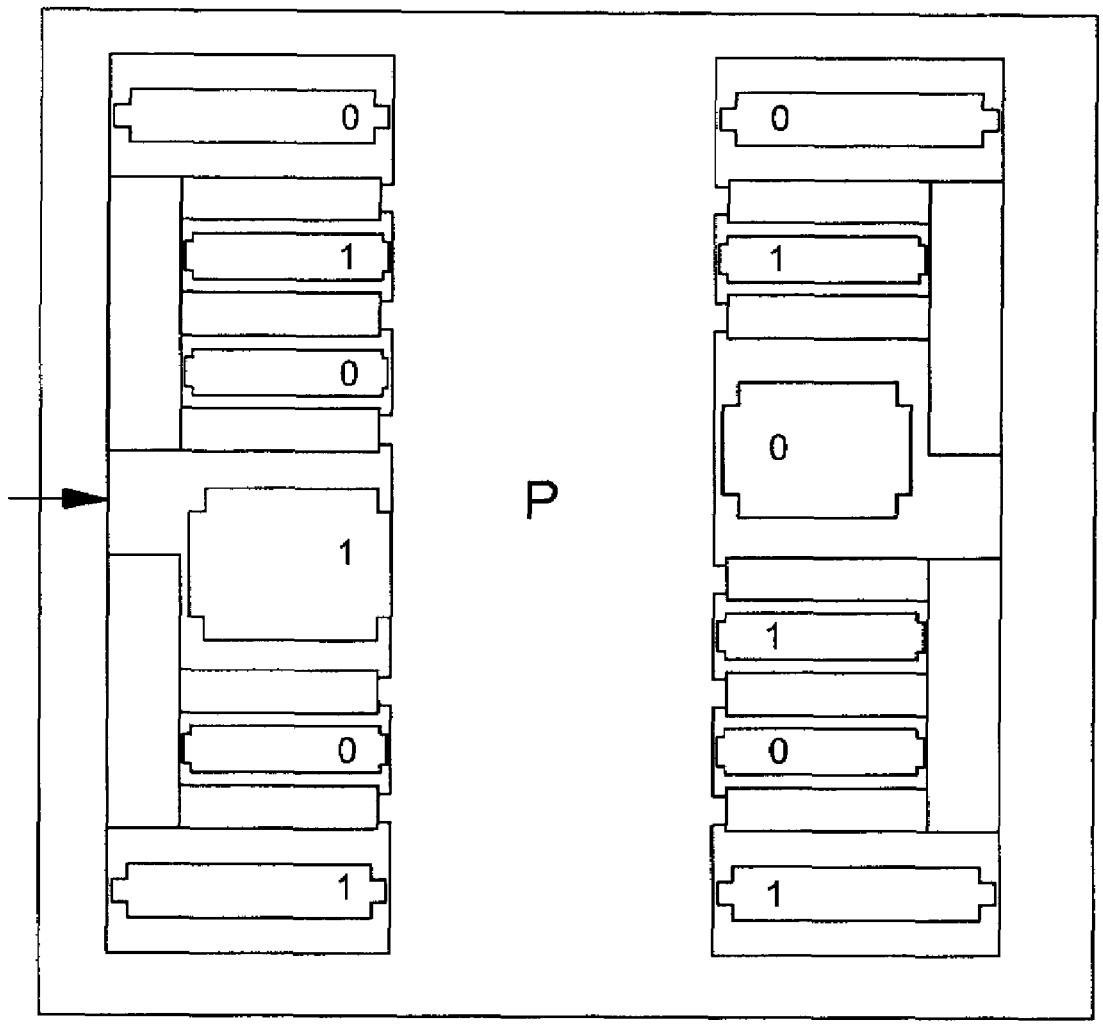
Figure 11:
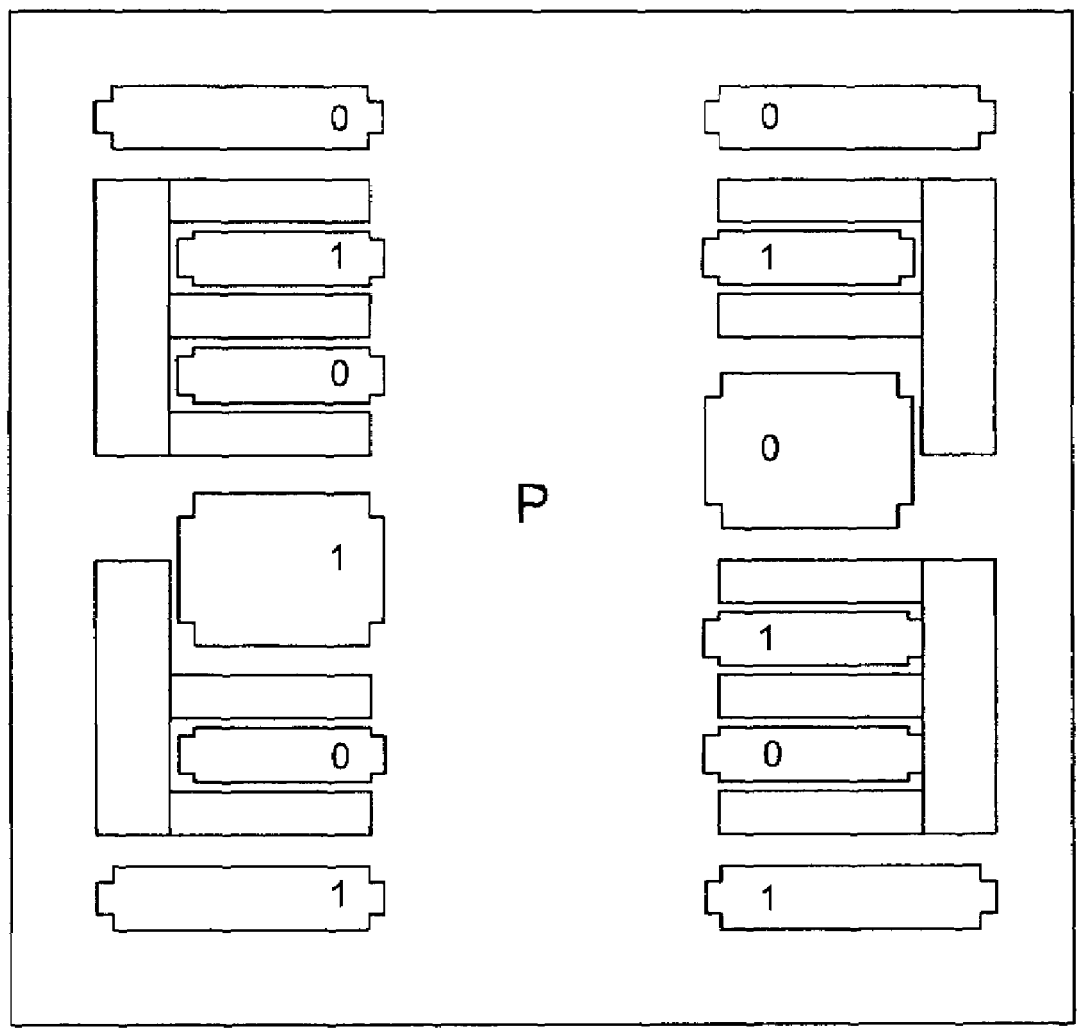

FIG. 9 shows the assembled OPC using the repeatable, hierarchical design units and that the local coloring of FIG. 8 was discarded. The global coloring of FIG. 5D is then added to the assembled OPC design of FIG. 10 resulting in the final colored design as shown in FIG. 11. FIG. 11 shows the final colored prime cell design which has been OPC'd but avoided the data flattening of the prior art and which OPC method takes significantly less computer processing time than with the prior art methods.

The present invention minimizes the mask fabrication problems encountered with large density packed data volumes since a mask design that requires coloring, such as for an alternating PSM design, often has a non conflict solution only at the top level of hierarchy. Special design techniques that would allow a phase aware placement tool to optimize the layout are not yet available. Thus, using current methodologies, flattened data is passed down to the Model Based OPC engine which spends many days in processing. The OPC method of the invention initially performs local coloring and performs OPC locally and within an area of optical interactions, without regard to the existence of a globally clean phase coloring solution in place at the time of performing the mask corrections. Only when the mask is fully decorated (i.e. OPC'd), the globally clean coloring solution must exist for correct mask fabrication. The method of the invention passes to the OPC engine cleanly locally colored design units that can be corrected nestedly (i.e. hierarchically) and recolored flat post OPC when data will be flattened anyway. This solution will save days of processing to create the mask design.

Likewise, for a patterning layer requiring coloring based decomposing into two separate photomask designs, the invention provides a means to do the OPC corrections on a hierarchical layout, which provides a significant speed advantage relative to flattened data processing. In this case, the OPC corrections for each of the mask layers may or may not be independent of each other. In a DE2 process, the images of each mask are typically exposed into separate photoresist films and subsequently transferred into a secondary film completely independently of each other. In this case, the OPC corrections for each mask layer can be done independently of each other. These independent corrections may be, but are not required to be, carried out in parallel (i.e. simultaneously) on each OPC processing unit. On the other hand, for a DE process the images of each mask typically add incoherently to each other in a single layer of photoresist. Because of this, the OPC for each DE mask will typically need to be aware of the presence of the other DE mask and the corrections for each DE mask layer will need to be done simultaneously in each OPC processing unit.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

Thus, having described the invention, what is claimed is:

1. A method for making a mask which mask is used to fabricate an integrated circuit device, comprising the steps of:
    providing a design layout comprising an arrangement of a plurality of instances of a hierarchical design unit of shapes that include uncolored shapes to be colored, said design layout is selected from the group consisting of an alternating phase shift mask design, a double-exposure mask design and a double-exposure-etch mask design;
    verifying that said design layout has a clean coloring solution by globally coloring said design layout to form global coloring information prior to locally coloring;
    reconfiguring said design layout into sub-processing units each including a subset of said shapes;
    locally coloring said subset of shapes within said sub-processing units to form a locally colored design unit;
    performing optical proximity correction (OPC) on said locally colored design unit to form an OPC-modified design unit;
    discarding said local coloring of said OPC-modified design unit to form an uncolored OPC-modified hierarchical design unit;
    arranging said uncolored OPC-modified hierarchical design unit to form a modified design layout in accordance with said arrangement;
    globally coloring said modified design layout in accordance with said global coloring information; and
    making a mask comprising said modified design layout.

2. A computer program product comprising a computer usable medium having computer readable program embodied in said medium for designing a mask, wherein the computer readable program when executed on a computer causes the computer to perform the method steps of:
    providing a design layout comprising an arrangement of a plurality of instances of a hierarchical design unit of shapes that include uncolored shapes to be colored, said design layout is selected from the group consisting of an alternating phase shift mask design, a double-exposure mask design and a double-exposure-etch mask design;
    verifying that said design layout has a clean coloring solution by globally coloring said design layout to form global coloring information prior to locally coloring;
    reconfiguring said design layout into sub-processing units each including a subset of said shapes;
    locally coloring said subset of shapes within said sub-processing units to form a locally colored design unit;
    performing optical proximity correction (OPC) on said locally colored design unit to form an OPC-modified design unit;
    discarding said local coloring of said OPC-modified design unit to form an uncolored OPC-modified hierarchical design unit;
    arranging said uncolored OPC-modified hierarchical design unit to form a modified design layout in accordance with said arrangement; and
    globally coloring said modified design layout in accordance with said global coloring information.

3. A method for fabricating an integrated circuit, comprising the steps of:
    providing a design layout comprising an arrangement of a plurality of instances of a hierarchical design unit of shapes that include uncolored shapes to be colored, said design layout is selected from the group consisting of an alternating phase shift mask design, a double-exposure mask design and a double-exposure-etch mask design;
    verifying that said design layout has a clean coloring solution by globally coloring said design layout to form global coloring information prior to locally coloring;
    reconfiguring said design layout into sub-processing units each including a subset of said shapes; locally coloring said subset of shapes within said sub-processing units to form a locally colored design unit;
    performing optical proximity correction (OPC) on said locally colored design unit to form an OPC-modified design unit;
    discarding said local coloring of said OPC-modified design unit to form an uncolored OPC-modified hierarchical design unit;
    arranging said uncolored OPC-modified hierarchical design unit to form a modified design layout in accordance with said arrangement;
    globally coloring said modified design layout in accordance with said global coloring information;
    fabricating a mask comprising said modified design layout; and
    patterning a substrate using said mask.

* * * * *